(12) United States Patent
Chen et al.

(10) Patent No.: US 12,543,272 B2
(45) Date of Patent: Feb. 3, 2026

(54) REFLOW OVEN

(71) Applicant: ILLINOIS TOOL WORKS INC., Glenview, IL (US)

(72) Inventors: Yuexin Chen, Suzhou (CN); Dong Zhang, Suzhou (CN)

(73) Assignee: Illinois Tool Works Inc., Glenview, IL (US)

( * ) Notice: Subject to any disclaimer, the term of this patent is extended or adjusted under 35 U.S.C. 154(b) by 626 days.

(21) Appl. No.: 17/115,426

(22) Filed: Dec. 8, 2020

(65) Prior Publication Data

US 2021/0176867 A1 Jun. 10, 2021

(30) Foreign Application Priority Data

Dec. 10, 2019 (CN) .......................... 201911257935.7

(51) Int. Cl.
*H05K 3/34* (2006.01)
*B23K 1/008* (2006.01)
(Continued)

(52) U.S. Cl.
CPC ........... *H05K 3/3494* (2013.01); *B23K 1/008* (2013.01); *B23K 3/0478* (2013.01); *F27B 9/40* (2013.01);
(Continued)

(58) Field of Classification Search
USPC .......................................................... 432/34
See application file for complete search history.

(56) References Cited

U.S. PATENT DOCUMENTS 5,413,164 A * 5/1995 Teshima ................. B23K 1/008
165/206
5,831,345 A * 11/1998 Michaud ................... H02J 1/14
361/170

(Continued)

FOREIGN PATENT DOCUMENTS

CN 101052293 10/2007
CN 102566625 7/2012
(Continued)

OTHER PUBLICATIONS

French Preliminary Search Report Appln No. 2012903 dated Apr. 20, 2022.

(Continued)

*Primary Examiner* — Steven B McAllister
*Assistant Examiner* — John E Bargero
(74) *Attorney, Agent, or Firm* — McAndrews, Held & Malloy, Ltd.

(57) ABSTRACT

The present disclosure discloses a reflow oven for processing a circuit board, the reflow oven comprising a heating zone having a plurality of heating sub-zones, in which the plurality of heating devices are arranged in corresponding heating sub-zones of the plurality of heating sub-zones, and each of the plurality of heating devices is configured such that a working temperature of the corresponding heating sub-zone is in a predetermined temperature interval; a start-stop device configured to activate or deactivate the plurality of heating devices, and configured to activate and deactivate the plurality of heating devices according to predetermined time intervals in a process during which the circuit board sequentially passes through the plurality of heating sub-zones, such that a working temperature of each of the plurality of heating sub-zones is in a corresponding predetermined temperature interval.

8 Claims, 4 Drawing Sheets

(51) Int. Cl.
    *B23K 3/047*     (2006.01)
    *F27B 9/40*     (2006.01)
    *B23K 101/42*     (2006.01)
    *F27D 19/00*     (2006.01)

(52) U.S. Cl.
    CPC .. *B23K 2101/42* (2018.08); *F27D 2019/0071* (2013.01)

(56) References Cited

U.S. PATENT DOCUMENTS

| | | | | |
|---|---|---|---|---|
| 5,971,249 A | * | 10/1999 | Berkin | F27B 9/243 228/103 |
| 2014/0129045 A1 | | 5/2014 | Kawai | |

FOREIGN PATENT DOCUMENTS

| | | |
|---|---|---|
| CN | 103648700 | 3/2014 |
| CN | 104503504 | 4/2015 |
| CN | 105188317 | 12/2015 |
| CN | 205137974 | 4/2016 |
| CN | 108262545 | 7/2018 |
| CN | 110385497 | 10/2019 |
| JP | 2008135658 | 6/2008 |
| JP | 2015078794 | 4/2015 |
| WO | 2013038456 | 3/2013 |

OTHER PUBLICATIONS

Examination Report Appln No. GB2019136.7 dated Feb. 16, 2022.
Search and examiniation Report Appln No. GB2019136.7 dated Jun. 3, 2021.

* cited by examiner

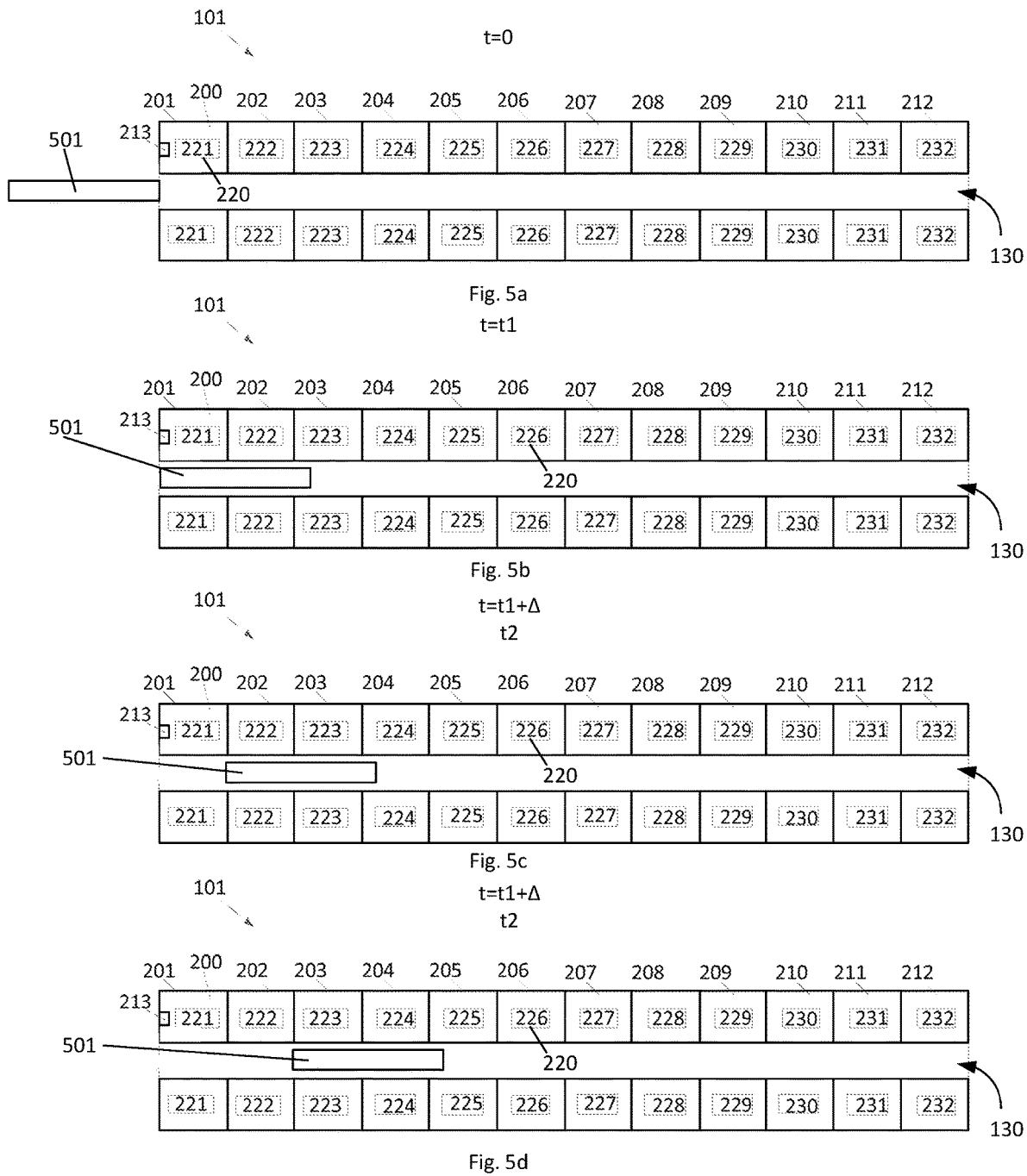

REFLOW OVEN

RELATED APPLICATIONS

The present application claims the benefit of Chinese Patent Application No. 201911257935.7, filed Dec. 10, 2019, entitled "REFLOW OVEN." The entirety of Chinese Patent Application No. 201911257935.7 is expressly incorporated herein by reference.

TECHNICAL FIELD

The present disclosure relates to the technical field of reflow ovens.

BACKGROUND

Reflow ovens are mainly configured to solder circuit boards where electronic elements have been mounted. When a reflow oven works, solder paste on the circuit board where an electronic element has been mounted is melted by means of a heating zone of the reflow oven, such that the electronic element and the solder joint of the circuit board are fused and soldered together. The solder paste on the circuit board where the electronic element has been mounted is cooled by means of a cooling zone of the reflow oven, such that the electronic element and the solder joint are solidified and connected together. The heating zone of the reflow oven has a predetermined temperature interval in the working process to provide the heat required for heating the solder paste to a melting temperature or a reflow temperature.

SUMMARY OF THE DISCLOSURE

The present disclosure provides a reflow oven, comprising a heating zone, a plurality of heating devices and a start-stop device. The heating zone comprises a plurality of heating sub-zones, and the plurality of heating sub-zones are sequentially arranged in a length direction of the reflow oven. The plurality of heating devices are arranged in corresponding heating sub-zones of the plurality of heating sub-zones, and each of the plurality of heating devices is configured such that a working temperature of the corresponding heating sub-zone is in a predetermined temperature interval. The start-stop device is configured to activate or deactivate the plurality of heating devices, and the start-stop device is configured in such a way that the start-stop device activates or deactivates the plurality of heating devices according to predetermined time intervals in a process during which the circuit board sequentially passes through the plurality of heating sub-zones, such that a working temperature of each of the plurality of heating sub-zones is in a corresponding predetermined temperature interval. In the present disclosure, the start-stop device is incorporated into the reflow oven. This is suitable for the operation of high-power heating devices in the heating zone, and avoids overheating of a hearth caused by thermal inertia of the high-power heating devices. Therefore, in addition to meeting requirements for soldering and processing of both large-sized circuit boards and small-sized circuit boards, the reflow oven according to present disclosure can further not only improve the processing efficiency of the large-sized circuit boards, but also ensure the processing quality of the large-sized circuit boards.

In the reflow oven as described above, the start-stop device activates or deactivates the plurality of heating devices according to predetermined time intervals and a predetermined sequence.

In the reflow oven as described above, the reflow oven is suitable for soldering circuit boards with different sizes and different amounts of soldering heat.

In the reflow oven as described above, the reflow oven comprises a position sensor, and the position sensor is located at an inlet position of the heating zone;

the heating sub-zone located at the inlet position of the heating hearth is referred to as first heating sub-zone, the N-th heating sub-zone counted from the inlet position of the heating hearth is referred to as N-th heating sub-zone, the start-stop device is configured to start counting time when the position sensor monitors that the circuit board enters the heating zone, and the start-stop device stops the operation of the heating device located in the first heating sub-zone when a cumulative counting time t reaches t1; and the start-stop device stops the operation of the heating device located in the N-th heating sub-zone when the cumulative counting time t reaches $t1+(N-1)\cdot \Delta t2$, wherein N is a natural number greater than 1.

In the reflow oven as described above, the circuit board has a traveling speed of v in the heating zone, each of the heating sub-zones has a length of H extending in the length direction of the reflow oven, and $\Delta t2=H/v$.

In the reflow oven as described above, the start-stop device is further configured in such a way that the start-stop device resumes the operation of the heating device located in the first heating sub-zone when the cumulative counting time t reaches $t1+\Delta t3$; and the start-stop device resumes the operation of the heating device located in the N-th heating sub-zone when the cumulative counting time t reaches $t1+N\cdot \Delta t3$.

In the reflow oven as described above, the circuit board has a traveling speed of v in the heating zone, each of the heating sub-zones has a length of H extending in the length direction of the reflow oven, and $\Delta t3=m*H/v$, wherein $1\leq m<N$.

In the reflow oven as described above, the circuit board has a length of L extending in the length direction of the reflow oven, and $t1=L/v$.

In the reflow oven as described above, the value of $\Delta t3$ is greater than that of $\Delta t2$.

In the reflow oven as described above, the extending length L of the circuit board is greater than the extending length H of the heating sub-zone.

Since a larger circuit board absorbs more heat while a smaller circuit board absorbs less heat, a temperature control system of the conventional reflow oven cannot meet heat requirements of soldering both large-sized circuit boards and small-sized circuit boards. When the temperature control system of the conventional reflow oven which is suitable for soldering small-sized circuit boards is used to solder large-sized circuit boards, it takes a very long time for the reflow oven to heat the hearth of the heating zone to a predetermined temperature range. This easily leads to excessively low circuit board production efficiency and cannot meet production requirements. After observation and research, the inventor found that when the reflow oven uses a heating device with smaller power in the heating zone, the temperature control system of the reflow oven can effectively control the temperature of the heating zone within a working temperature range because of the small heating inertia of the heating device, and when the reflow oven uses a high-power heating device in the heating zone, although the heating device can meet temperature requirements for processing circuit boards with high heat absorption in the outset, due to the "inertia of temperature rise" of the high-power heating device, the temperature of the hearth then will continue to rise until it exceeds a predetermined temperature interval if the heating device is controlled by using the conventional temperature control system. As a result, it cannot meet the soldering temperature requirements.

In order to meet the processing requirements of large-sized circuit boards, the reflow oven of the present disclosure is suitable for the operation of high-power heating devices. Besides, in order to suppress the overheating of the hearth caused by thermal inertia of the high-power heating devices, in the present disclosure, the reflow oven is provided with the start-stop device such that the operating states of the heating devices in individual heating sub-zones in the reflow oven are regularly controlled by the start-stop device at predetermined time intervals. This effectively maintains temperature of the hearth in each heating sub-zone within the predetermined temperature interval thereof, and ensures that the large-sized circuit boards are properly and stably soldered and processed in the reflow oven.

BRIEF DESCRIPTION OF THE DRAWINGS

FIGS. 5A to 5D show an embodiment in which the operation of heating devices 221 is stopped by using the start-stop device 300 in FIG. 3.

DETAILED DESCRIPTION OF EMBODIMENTS

Figure 1:
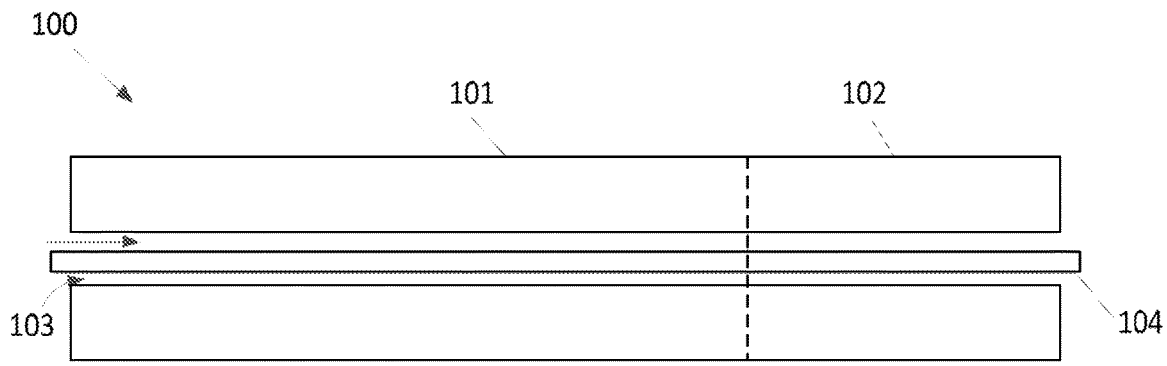
FIG. 1 is a schematic diagram of a reflow oven 100 according to the present disclosure.

Specific embodiments of the present disclosure are described below with reference to the accompanying drawings which constitute part of this description. It should be understood that although the terms such as "front", "rear", "upper", "lower", "left", and "right" indicating directions in the present disclosure are used to describe various exemplary structural parts and elements in the present disclosure, these terms used herein are merely used for ease of description and are determined based on the exemplary orientation shown in the accompanying drawings. Since the embodiments disclosed in the present disclosure can be arranged in different directions, these terms indicating directions are only illustrative and should not be considered as limitations. If possible, the same or similar reference numerals used in the present disclosure refer to the same components.

FIG. 1 is a schematic diagram of a reflow oven 100 according to the present disclosure, showing the internal structure seen from a side of the reflow oven 100. As shown in FIG. 1, the reflow oven 100 comprises a heating zone 101 and a cooling zone 102, and the heating zone 101 and the cooling zone 102 are in communication with each other. A hearth 103 is provided by running through the whole heating zone 101 and cooling zone 102, an extending direction of the hearth 103 is consistent with a length direction of the reflow oven 100, and the hearth is used to provide a space for soldering and processing a circuit board. The hearth 103 is located at a middle position in a height direction of the reflow oven 100, and divides each of the heating zone 101 and the cooling zone 102 into an upper portion and a lower portion. A conveying device 104 is arranged inside the hearth 103. The conveying device 104 extends in the whole length direction of the hearth 103 and is configured to bear the circuit board and help to convey the circuit board in the whole hearth 103. The above arrangement enables the reflow oven 100 to perform soldering and processing on the circuit board in upper and lower directions. When the reflow oven 100 starts to work, the circuit board is placed on the conveying device 104, enters the reflow oven 100 from an inlet of the heating zone 101 in the direction indicated by the arrow in FIG. 1, and is conveyed in the heating zone 101 with the conveying device 104. During conveying circuit board in the heating zone 101, the heat in the heating zone 101 gradually melts solder paste distributed on the circuit board. After the circuit board is transferred from the heating zone 101 to the cooling zone 102 by the conveying device 104, due to the low temperature in the cooling zone 102, the solder paste on a soldering area of the circuit board is solidified due to being cooled. This causes an electronic element to be connected to the circuit board. After passing through the cooling zone 102, the circuit board is transferred out of the reflow oven 100 by the conveying device 104, and the reflow oven 100 completes the soldering and processing on the circuit board. In this embodiment, the conveying device 104 conveys the circuit board at a constant speed v in the reflow oven 100, wherein the conveying speed of the conveying device 104 is 30-100 cm/min. In other embodiments, the conveying device 104 may also be set to other conveying speeds.

In this embodiment, the reflow oven 100 comprises two zones: the heating zone 101 and the cooling zone 102. In other embodiments, the reflow oven 100 may be further provided with an isolation and exhaust zone between the heating zone 101 and the cooling zone 102, and in this case, the heating zone 101, the cooling zone 102 and the isolation and exhaust zone are also in fluid communication with one another. The arrangement of the isolation and exhaust zone can not only have a heat isolation function between the high-temperature heating zone 101 and the low-temperature cooling zone 102, but can also extract gas from the hearth 103 of the heating zone 101 and discharge the extracted gas out of the hearth 103, thereby preventing the gas containing volatile pollutants from the hearth 103 of the heating zone 101 from entering the hearth 103 of the cooling zone 102.

Figure 2:
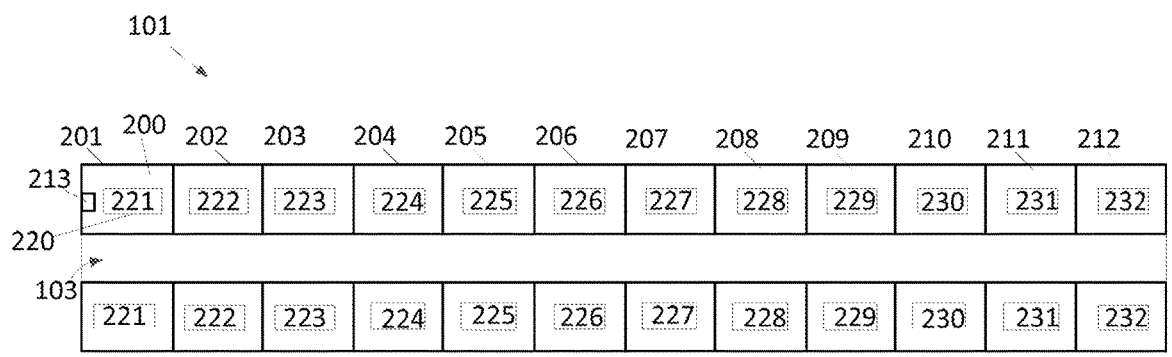
FIG. 2 is a schematic diagram of a heating hearth 101 of the reflow oven 100 in FIG. 1.

FIG. 2 is a schematic diagram of the heating zone 101 of the reflow oven 100 in FIG. 1. For ease of illustration, compared with FIG. 1, the conveying device 104 is omitted from FIG. 2. As shown in FIG. 2, the heating zone 101 comprises a plurality of heating sub-zones 200, and the plurality of heating sub-zones 200 are sequentially arranged in the length direction of the reflow oven 100. The heating sub-zone located at the inlet position of the heating zone 101 is referred to as first heating sub-zone 201, the N-th heating sub-zone counted from the inlet position of the heating zone 101 is referred to as N-th heating sub-zone, and so on. A front end of the first heating sub-zone 201 is provided with a position sensor 213 for sensing the position of the circuit board entering this zone. In this embodiment, there are twelve heating sub-zones 200 in total in the heating zone 101, and each heating sub-zone 200 has the same length of H extending in the length direction of the reflow oven 100. The twelve heating sub-zones 200 are sequentially arranged from left to right from the inlet position of the heating zone 101 as follows: the first heating sub-zone 201, a second heating sub-zone 202, a third heating sub-zone 203, a fourth heating sub-zone 204, a fifth heating sub-zone 205, a sixth heating sub-zone 206, a seventh heating sub-zone 207, an eighth heating sub-zone 208, a ninth heating sub-zone 209, a tenth heating sub-zone 210, an eleventh heating sub-zone 211, and a twelfth heating sub-zone 212. It is worth noting that the number of the heating sub-zones 200 of the reflow oven 100 may be changed according to products to be soldered, and is not only limited to the embodiment shown in FIG. 2. For example, in some other embodiments, for a certain type of circuit boards, ten heating sub-zones 200 may be provided in the reflow oven 100.

As shown in FIG. 2, the hearth 103 runs through all the heating sub-zones 200 in the arrangement direction of the heating sub-zones 200, and each heating sub-zone is divided into an upper portion and a lower portion by the hearth 103. Both the upper portion and the lower portion of each heating sub-zone 200 are provided with a heating device 220, and the upper and lower heating devices 220 cooperatively control the temperature in the heating sub-zone 200. That is, two first heating devices 221 are provided in the first heating sub-zone 201, and the two first heating devices 221 are located above and below the hearth 103 in the first heating sub-zone 201, respectively. Two second heating devices 222 are arranged in the second heating sub-zone 202, and the two second heating devices 222 are located above and below the hearth 103 in the second heating sub-zone 202, respectively. In a similar fashion, two N-th heating devices 220 are provided in the N-th heating sub-zone 200, and the two N-th heating devices 220 are located above and below the hearth 103 in the N-th heating sub-zone 200, respectively, wherein N is a natural number less than or equal to 12. Corresponding to the twelve heating sub-zones 200, there are totally twenty-four heating devices 220 provided in the heating zone 101 in this embodiment.

In order to ensure the processing effect of the circuit board in the heating zone 101, the working temperature of each heating sub-zone 200 of the plurality of heating sub-zones 200 is in a predetermined temperature interval. The upper and lower heating devices 200 located in the same heating sub-zone 200 work cooperatively to keep the working temperature of each heating sub-zone 200 within the corresponding predetermined temperature interval thereof. In this embodiment, the heating devices 220 perform heating by using heating resistors, and each heating device 220 has an independent input interface, so that each heating sub-zone 200 can work independently, and different heating sub-zones 200 can satisfy different predetermined temperature intervals. In addition, each independent heating device 220 corresponds to an independent temperature control mode, such that the heating device 220 can be independently controlled. In this embodiment, the temperature control mode of the heating device 220 is as follows: the heating device 220 located at the upper portion of the heating sub-zone 200 is provided with a temperature sensor at the top of the hearth 103 corresponding to the heating sub-zone 200, the heating device 220 at the upper portion stops heating when the temperature of the top of the hearth 103 is higher than the predetermined temperature interval of the heating sub-zone 200, and the heating device 220 at the upper portion resumes heating when the temperature of the top of the hearth 103 is lower than the predetermined temperature interval of the heating sub-zone 200; and the heating device 220 located at the lower portion of the heating sub-zone 200 is provided with a temperature sensor at the bottom of the hearth 103 corresponding to the heating sub-zone 200, the heating device 220 at the lower portion stops heating when the temperature of the bottom of the hearth 103 is higher than the predetermined temperature interval thereof, and the heating device 220 at the lower portion resumes heating when the temperature of the bottom of the hearth 103 is lower than the predetermined temperature interval of the heating sub-zone 200. The provision of separately controllable heating devices 220 in the upper portion and the lower portion of the same heating sub-zone 200 is helpful to promote the uniform distribution of the temperature in the hearth 103 corresponding to each heating sub-zone 200, and ensures that the heating devices 220 accurately control the temperature of the hearth 103 in the corresponding heating sub-zone 200.

In this embodiment, the heating device 220 uses a heating resistor to heat the hearth 103, and the working temperature of each heating sub-zone 200 is approximately 100-300° C. Since the heat absorption amount of small-sized circuit boards is small and the heating temperature rising rate is fast, while the heat absorption amount of large-sized circuit boards is large and the heating temperature rising rate is slow, in order to meet heating requirements of different sizes of circuit boards, the reflow oven 100 of the present disclosure has adjustable heating resistance power. Different resistance power of the reflow oven 100 can be implemented by adjusting the heating resistance. When processing large-sized circuit boards, the heating device 220 uses a high-power resistor for heating; and when processing small-sized circuit boards, the heating device 220 uses a low-power resistor for heating. However, when the power of the heating resistor is relative high, the relative high heating power will bring greater inertia of temperature rise. In this case, relying on only inherent temperature control logic of the heating device 220 will lead to the occurrence of overheating of the hearth 103. Therefore, in order to meet requirements of processing circuit boards with different sizes, in the present disclosure, a start-stop device 300 is incorporated into the reflow oven 100. The provision of the start-stop device 300 can implement additional control over the heating device 220 besides the temperature control logic of the heating device 220 itself.

When a small-sized circuit board such as a circuit board with a size of 200 mm*300 mm is processed, the resistance power of the heating device 220 of the reflow oven 100 is set to 3-5 kW. Since the thermal inertia of the heating device 220 is small under a low-power working condition, there is no need additional control to the heating device 220 in this case, and the requirements for the working temperature of each heating sub-zone 200 can be met by using only the temperature control logic of the heating device itself (that is, heating is stopped when the temperature in the hearth 103 corresponding to each heating sub-zone 200 is higher than the predetermined temperature interval thereof, and heating is resumed when the temperature is lower than the predetermined temperature interval thereof).

When a large-sized circuit board is processed, in order to improve the temperature rise efficiency of each heating sub-zone 200 to the circuit board, the heating device 220 in the reflow oven 100 is set to a higher resistance power. For example, when a circuit board becomes a 5G circuit board with the size increased to 600 mm*800 mm, the resistance power of the heating device 220 is increased to 8-10 kW, such as 9.5 kW. Under the temperature control logic of the heating device 220 itself, when the temperature sensor monitors that the temperature in the hearth 103 is at the upper limit of the predetermined temperature interval, the heating device 220 will stop the heating of the hearth 103 by the heating resistor of the corresponding heating sub-zone 200. However, since the heating resistor of the heating device 220 works with higher heating power before the heating is stopped, in this case, even if the heating is stopped immediately, the residual heat of the heating resistor will still make the temperature of the hearth 103 rise. This makes the temperature of the hearth 103 exceed the predetermined heating interval of the corresponding heating sub-zone 200. That is, when the reflow oven 100 works with relative high heating power, the large inertia of temperature rise will cause overheating of the hearth 103, and the temperature control logic of the heating device 220 itself cannot meet requirements of processing of large-sized circuit boards.

In order to meet the requirements of processing of large-size circuit boards, in the present disclosure, an additional start-stop device 300 is incorporated into the reflow oven 100. When the heating device 220 works with a high-power resistor, the start-stop device 300 enables the reflow oven 100 to stop a temperature control operation of the corresponding heating device 220 on the hearth 103 before the overheating of the hearth 103 in the heating zone 101 occurs. Therefore, in the reflow oven 100 of the present disclosure, even under the working condition of using high-power resistors, the control temperature of the hearth 103 can always meet the working temperature requirements of the processed circuit board for each heating sub-zone 200, thereby avoiding overheating of the hearth 103.

Figure 3:
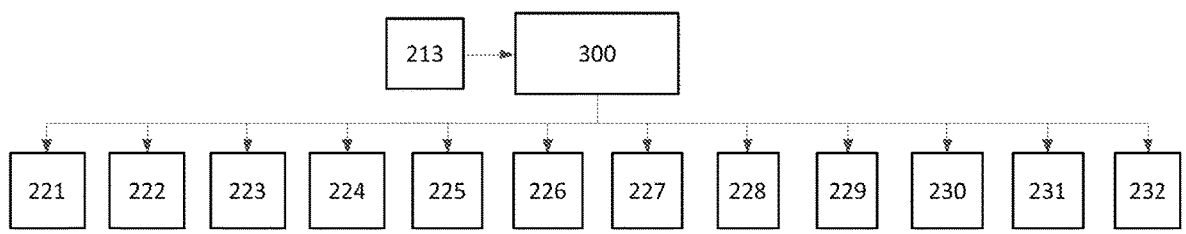
FIG. 3 is a schematic diagram showing the control of a plurality of heating devices 220 by a start-stop device 300 of the reflow oven 100 in FIG. 1.

FIG. 3 is a schematic diagram showing the control of the plurality of heating devices 220 by the start-stop device 300 of the reflow oven 100 in FIG. 1. As shown in FIG. 3, the start-stop device 300 communicates with the position sensor 213, such that the start-stop device 300 can receive signals from the position sensor 213. Besides, the start-stop device 300 further communicates with the heating devices 220 in the plurality of heating sub-zones 200, wherein the heating devices 220 comprise the first heating devices 221 to the twelfth heating devices 232. Since the temperature of the hearth 103 in the same heating sub-zone 200 is controlled by two heating devices 220 at the same time, the start-stop device 300 controls two heating devices 220 installed in the same heating sub-zone 200 in a consistent way. That is, the start-stop device 300 can implement the start-stop control over the two heating devices 220 at the same time. The start-stop control includes two control modes: stopping the operation of the heating device 220 and resuming the operation of the heating device 220. When the operation of the heating device 220 is stopped, the heating device 220 immediately stops heating and no longer works according to the original temperature control logic of the heating device 220. In some embodiments, when the operation of the heating device 220 is stopped, the temperature sensor corresponding to the heating device 220 can continue to monitor the temperature at the corresponding position in the hearth 103, but even the temperature in the hearth 103 is lower than a predetermined temperature interval at this time, the heating device 220 will not re-activate the heating resistor for heating. When the operation of the heating device 220 is resumed, the heating device 220 activates to work according to the original temperature control logic. In this case, if the temperature of the corresponding hearth 103 monitored by the temperature sensor is lower than the predetermined temperature interval thereof, the heating resistor immediately resumes heating. If the temperature of the corresponding hearth 103 monitored by the temperature sensor is higher than the predetermined temperature interval thereof, the heating resistor is still kept in a stopped state and will not resume to the heating state until the temperature of the corresponding hearth 103 is lower than the predetermined temperature interval thereof.

Figure 4:
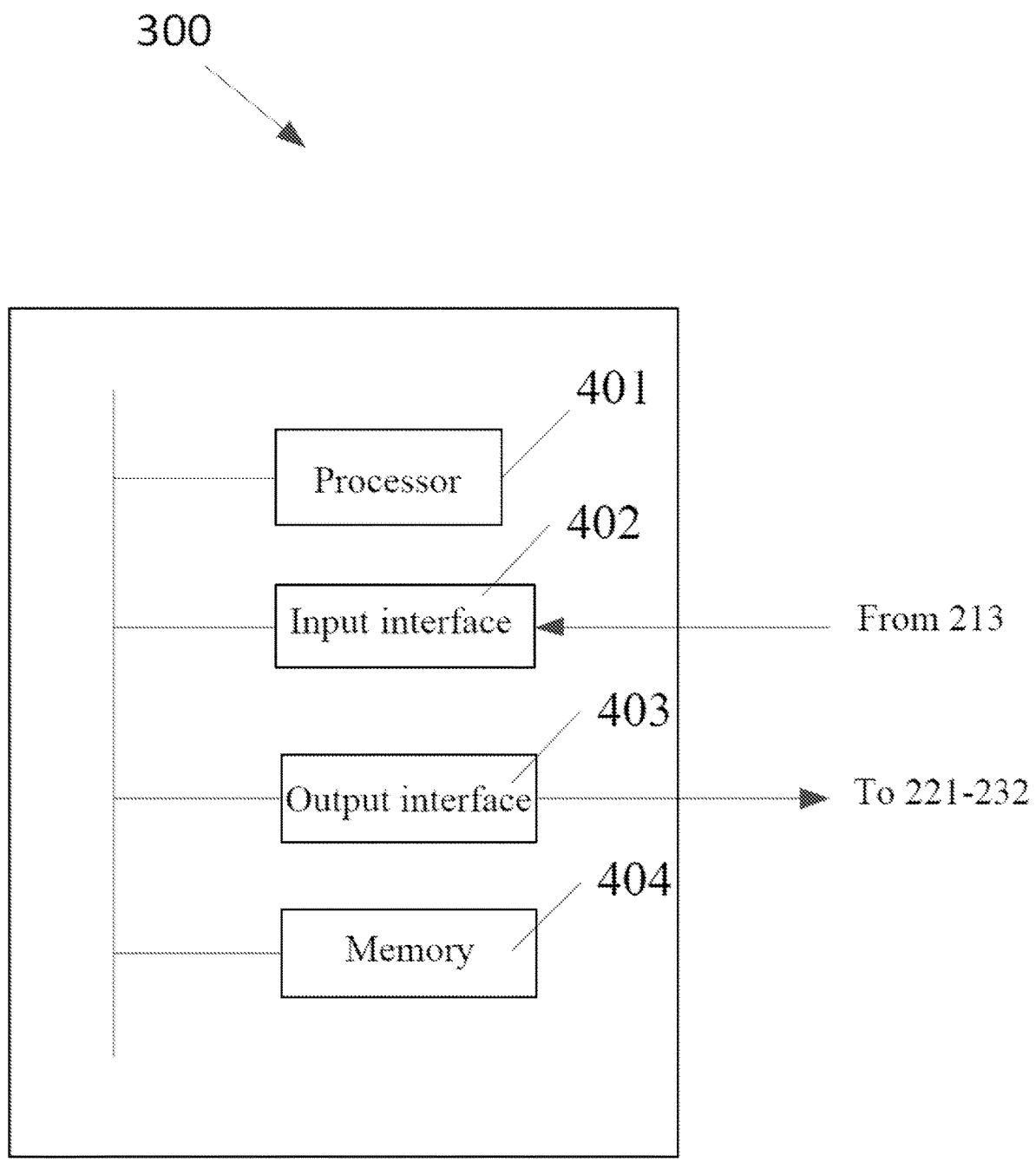
FIG. 4 is a schematic diagram of an internal structure of the start-stop device 300 in FIG. 3.

FIG. 4 is a schematic diagram of an internal structure of the start-stop device 300 in FIG. 3. As shown in FIG. 4, the start-stop device 300 comprises a processor 401, an input interface 402, an output interface 403 and a memory 404. The input interface 402 is configured to receive signals from the position sensor 213, the output interface is configured to send control signals to the first heating devices 221 to the twelfth heating devices 232, the memory 404 is configured to store control programs of the start-stop device 300 and signals received by the start-stop device 300, and the processor 401 can process the signals received by the input interface 402 and run the control programs stored in the memory 404 in response to the signals from the input interface 402.

FIGS. 5A to 5D show an embodiment in which the operation of the heating devices 221 is stopped by using the start-stop device 300 in FIG. 3. As shown in FIG. 5A, a circuit board 501 placed on the conveying device 104 (not shown in FIGS. 5A to 5D) just enters the heating zone 101. When a front end of the circuit board 501 just enters an inlet of the heating zone 101, the position sensor 213 sends a counting time signal to the input interface 402 of the start-stop device 300 upon monitoring the circuit board 501. After receiving the timing signal, the processor 401 starts counting time, and in this case the time is recorded as t=0. Subsequently, the circuit board 501 enters the first heating zone 201 with the conveying device 104 at a constant speed v.

When a cumulative courting time t reaches t1, the circuit board 501 enters a position shown in FIG. 5B, and the output interface 403 of the start-stop device 300 sends a stop signal to the first heating devices 221 to stop the operation of the first heating devices 221. In this case, the heating resistor of first heating device 221 stops working and no longer works according to the original temperature control logic of the first heating device 221. As shown in FIG. 5B, in this embodiment, when the cumulative counting time t reaches t1, an rear end of the circuit board 501 just enters the inlet of the first heating zone 201, and the whole circuit board 501 completely enters the reflow oven 100. Within the time interval t1, the circuit board is conveyed by a distance equal to its own length L, that is, t1=L/v.

When the cumulative counting time t reaches t1+Δt2, the circuit board 501 enters a position shown in FIG. 5C, and the output interface 403 of the start-stop device 300 sends a stop signal to the second heating devices 222 to stop the operation of the second heating devices 222. In this case, the heating resistor of second heating device 222 stops working and no longer works according to the original temperature control logic of the second heating device 222. As shown in FIG. 5C, in this embodiment, when the cumulative counting time t reaches t1+Δt2, the rear end of the circuit board 501 just enters an inlet of the second heating zone 202. Within the time interval ≠t2, the circuit board is conveyed by a distance equal to the extending length H of the first heating sub-zone 201, that is, Δt2=H/v.

When the cumulative counting time t reaches t1+2*Δt2, the circuit board 501 enters a position shown in FIG. 5D, and the output interface 403 of the start-stop device 300 instantly sends a stop signal to the third heating devices 223 to stop the operation of the third heating devices 223. In this case, the heating resistor of third heating device 223 stops working and no longer works according to the original temperature control logic of the third heating device 223. As shown in FIG. 5D, in this embodiment, when the cumulative counting time t reaches t1+2*Δt2, the rear end of the circuit board 501 just enters an inlet of the third heating zone 203.

Within the time interval $2*\Delta t2$, the circuit board in conveyed by a distance equal to the extending length of the first heating sub-zone 201 and the second heating sub-zone 202.

In a similar fashion, when the cumulative counting time t reaches $t1+(N-1)*\Delta t2$, the output interface 403 of the start-stop device 300 sends a stop signal to the N-th heating devices 220 to stop the operation of the N-th heating devices 220. In this case, the heating resistor of each N-th heating device 220 stops working and no longer works according to the original temperature control logic of the N-th heating device 220.

The time interval for the start-stop device 300 to control the heating device 220 to stop operation can be determined according to the size of the circuit board. Since the large-sized circuit board absorbs more heat, while the small-sized circuit board absorbs less heat, different sizes of circuit boards have different heat requirements. The start-stop device 300 used in the reflow oven 100 of the present disclosure can be suitable for soldering and processing circuit boards with different sizes. In order to match the heat absorbed by circuit boards with different sizes, in other embodiments, the start-stop device 300 may also use other time interval modes to sequentially control the first heating devices 221 to the twelfth heating devices to stop the operation thereof, that is, in the equation $t=t1+(N-1)*\Delta t2$ expressing the cumulative counting time at which the N-th heating device 220 is controlled to stop operation, t1 and $\Delta t2$ may be set to other suitable values.

Figure 6A:
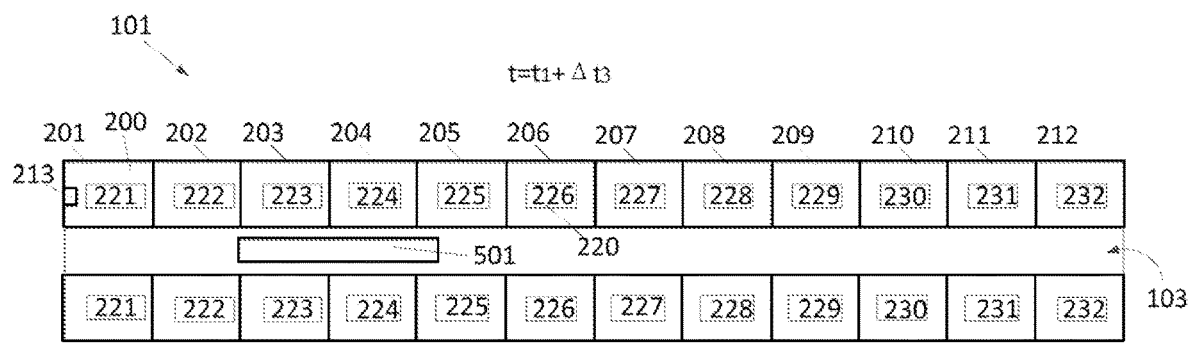
FIGS. 6A and 6B show an embodiment in which the operation of the heating devices 221 is resumed by using the start-stop device 300 in FIG. 3.
Figure 6B:
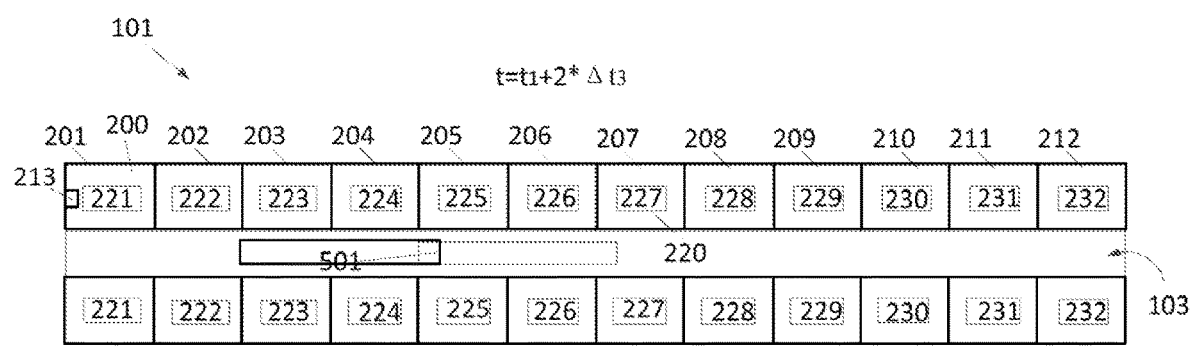

FIGS. 6A and 6B show an embodiment in which the operation of the heating devices 221 is resumed by using the start-stop device 300 in FIG. 3. As the cumulative time is counted by the processor 401, when the cumulative time t reaches $t1+\Delta t3$, the circuit board 501 enters a position shown in FIG. 6A. In this case, the output interface 403 of the start-stop device 300 sends a re-activate signal to the first heating device 221 to resume the operation of the first heating devices 221, such that the first heating devices 221 work according to the original temperature control logic thereof. As shown in FIG. 6A, in this embodiment, when the cumulative counting time t reaches $t1+\Delta t3$, the rear end of the circuit board 501 just enters an inlet of the third heating zone 203. Since the rear end of the circuit board just enters the inlet of the first heating zone 201 when the cumulative counting time t is t1, within the time $\Delta t3$, the circuit board is conveyed by a distance equal to the extending lengths 2H of two heating sub-zones 201, that is, $\Delta t3=2H/v$.

When the cumulative counting time t reaches $t1+2*\Delta t3$, the circuit board 501 enters a position shown in FIG. 6B. In this case, the output interface 403 of the start-stop device 300 sends a re-activate signal to the second heating devices 222 to resume the operation of the second heating devices 222, so that the second heating devices 222 work according to the original temperature control logic thereof. As shown in FIG. 6B, in this embodiment, when the cumulative counting time t reaches $t1+2*\Delta t3$, the rear end of the circuit board 501 just enters an inlet of the fifth heating sub-zone 205. Within the time interval $2*\Delta t3$, the circuit board is conveyed by a distance equal to the extending lengths 4H of four heating sub-zones 200.

In a similar fashion, when the cumulative counting time t reaches $t1+N*\Delta t3$, the output interface 403 of the start-stop device 300 sends a re-activate signal to the N-th heating devices 220 to resume the operation of the N-th heating devices 220. In this case, the N-th heating devices 220 work according to the original temperature control logic thereof. The time interval for the start-stop device 300 to control the re-activate of the heating device 220 may be determined according to the size of the circuit board. In other embodiments, the start-stop device 300 may also use other time interval modes to sequentially control the first heating devices 221 to the twelfth heating devices to re-activate the operation thereof. For example, in the equation $t1+N*\Delta t3$ expressing the time interval during which the N-th heating devices 220 are re-activate, $\Delta t3$ is set to $\Delta t3=m*H/v$, wherein $1 \leq m < N$. In some embodiments, the start-stop device 300 sets $\Delta t3$ to be always greater than $\Delta t2$, thereby ensuring that a moment at which the operation of a heating device 220 is resumed is always later than a moment at which operation of the heating device 220 is stopped.

In order to ensure the working efficiency of soldering and processing, when circuit boards with large heat absorption (large surface area and large size) are soldered, it is necessary to use heating devices with large power, but the problem lies in: because of the high power, the inertia of temperature rise of heating is large, and it is not easy to control the temperature of each heating sub-zone within the preset temperature interval thereof. One of the technical effects of the present disclosure is: according to the heat absorption and the speed of a heating board traveling in the hearth, the overheating in the hearth is prevented by the method of time-based start-stop, so as to ensure the normal soldering processing of the large-sized circuit boards.

The present disclosure has another technical effect that the reflow oven 100 of the present disclosure is suitable for processing circuit boards with different heat absorption amount, and can be applied to both circuit boards with larger heat absorption amount (larger surface area and larger size) and circuit boards with smaller heat absorption amount (smaller surface area and smaller size). Specifically, in the reflow oven 100 of the present disclosure, when the heating device 220 with higher power is selected to work in the heating zone 101, the heating device 220 generates an enough amount of heat to heat the circuit board with higher heat absorption amount, and when the heating device 220 with lower power is selected to work, the amount of heat generated by the heating device 220 is suitable for heating the circuit board with lower heat absorption amount. When a small-sized circuit board is soldered, the heating device is activated or deactivated according to the temperature control logic of the heating device 220 itself, such that the hearth temperature does not exceed the predetermined temperature range; on the other hand, when a large-sized circuit board is soldered, it is necessary to use the start-stop device 300 to perform additional start-stop control on the heating device 220 in addition to the temperature control logic of the heating device 220 itself, such that the temperature of the hearth does not exceed the working temperature range. Therefore, the start-stop solution of the present invention can properly control the heating inertia of the heating device 220 under high-power working conditions, and is also suitable for processing large-sized circuit boards and small-sized circuit boards. In addition, since the additional control over the heating device 220 by using the start-stop device 300 in the present disclosure is achieved by using time intervals, instead of comparing temperature parameters acquired by using the temperature sensor, to control the activation and deactivation of the heating device 220, this method for controlling the reflow oven 100 by incorporating an additional start-stop device 300 therefore implements a simple structure and reliable control.

The invention claimed is:

1. A reflow oven for processing a circuit board, wherein the reflow oven comprises:

a heating zone, wherein the heating zone comprises a plurality of heating sub-zones, and the plurality of heating sub-zones are sequentially arranged in a length direction of the reflow oven;

a plurality of heating devices, wherein the plurality of heating devices are arranged in corresponding heating sub-zones of the plurality of heating sub-zones, and each of the plurality of heating devices is configured such that a working temperature of the corresponding heating sub-zone is in a predetermined temperature interval; and a start-stop device configured to:
activate or deactivate the plurality of heating devices such that a working temperature of each of the plurality of heating sub-zones is in a corresponding predetermined temperature interval;
start counting time when a front end of the circuit board enters an inlet of the heating zone; and
for each of the heating sub-zones, when the start-stop device reaches a cumulative counting time corresponding to the heating sub-zone, deactivate the heating devices of the heating sub-zone such that the plurality of heating devices of the heating sub-zone do not receive power to operate, wherein the plurality of heating devices comprise temperature control logic configured to control the plurality of heating devices to heat the respective zones based on comparing a detected zone temperature to the corresponding predetermined temperature interval and, when the start-stop device deactivates one of the plurality of heating devices based on the cumulative counting time, power to that heating device is deactivated and that heating device immediately stops heating at a time interval corresponding to the cumulative counting time and, while deactivated, does not heat the corresponding zone when the detected zone temperature is less than the corresponding predetermined temperature interval according to the temperature control logic of that heating device.

2. The reflow oven according to claim 1, wherein the start-stop device activates or deactivates the plurality of heating devices according to predetermined time intervals and a predetermined sequence.

3. The reflow oven according to claim 2, wherein the reflow oven is suitable for soldering circuit boards with different sizes and different amounts of soldering heat.

4. The reflow oven according to claim 1, wherein the reflow oven comprises a position sensor, and the position sensor is located at an inlet position of the heating zone;
the heating sub-zone located at the inlet position of the heating zone is referred to as first heating sub-zone, an N-th heating sub-zone counted from the inlet position of the heating zone is referred to as N-th heating sub-zone, the start-stop device is configured to start counting time when the position sensor monitors that the circuit board enters the heating zone, and the start-stop device stops the operation of the heating device located in the first heating sub-zone when a cumulative counting time t reaches $t_1$; and the start-stop device stops the operation of the heating device located in the N-th heating sub-zone when the cumulative counting time t reaches $t_1+(N-1)\cdot\Delta t_2$, wherein N is a natural number greater than 1, wherein the circuit board has a traveling speed of v in the heating zone, each of the heating sub-zones has a length of H extending in the length direction of the reflow oven, and $\Delta t2=H/v$.

5. The reflow oven according to claim 4, wherein the start-stop device is further configured in such a way that the start-stop device resumes the operation of the heating device located in the first heating sub-zone when the cumulative counting time t reaches $t_1+\Delta t_3$; and the start-stop device resumes the operation of the heating device located in the N-th heating sub-zone when the cumulative counting time t reaches $t_1+N\cdot\Delta t_3$, wherein the circuit board has a traveling speed of v in the heating zone, each of the heating sub-zones has a length of H extending in the length direction of the reflow oven, and $\Delta t_3=m*H/v$, wherein $1\leq m<N$.

6. The reflow oven according to claim 5, wherein the circuit board has a length of L extending in the length direction of the reflow oven, and $t_1=L/v$.

7. The reflow oven according to claim 5, wherein the value of $\Delta t_3$ is greater than that of $\Delta t_2$.

8. The reflow oven according to claim 6, wherein the extending length L of the circuit board is greater than the extending length H of the heating sub-zone.

* * * * *